(12) United States Patent
Han et al.

(10) Patent No.: US 6,447,983 B1
(45) Date of Patent: Sep. 10, 2002

(54) SMART PHOTOLITHOGRAPHY

(75) Inventors: Yong Han, Seoul; Young-rag Do, Suwon; Joon-bae Lee, Yongin, all of (KR)

(73) Assignee: Samsung SDI Co., Ltd., Kyungki-do (KR)

( * ) Notice: Subject to any disclaimer, the term of this patent is extended or adjusted under 35 U.S.C. 154(b) by 0 days.

(21) Appl. No.: 09/508,769

(22) PCT Filed: May 4, 1998

(86) PCT No.: PCT/KR98/00121

§ 371 (c)(1),
(2), (4) Date: May 24, 2000

(87) PCT Pub. No.: WO99/14634

PCT Pub. Date: Mar. 25, 1999

(30) Foreign Application Priority Data

Sep. 18, 1997 (KR) .............................. 97-47602

(51) Int. Cl.⁷ ......................... G03F 7/004; G03F 7/028
(52) U.S. Cl. ...................... 430/313; 430/315; 430/328; 430/322
(58) Field of Search ................. 430/313–315, 430/328, 322

(56) References Cited

U.S. PATENT DOCUMENTS

| 4,767,642 A | 8/1988 | Shimizu et al. ............ 427/54.1 |
| 5,384,007 A | 1/1995 | Fischer ....................... 156/640 |

FOREIGN PATENT DOCUMENTS

JP     7-219236    *    8/1995

OTHER PUBLICATIONS

IBM Technical Disclosure Bulletin, Planarizing Metal Insulator Structures, Jan. 1983, vol. 25, Iss. No. 8, p. No. 4141.*

* cited by examiner

*Primary Examiner*—Mark F. Huff
*Assistant Examiner*—Daborah Chacko-Davis
(74) *Attorney, Agent, or Firm*—Leydig, Voit & Mayer, Ltd

(57) ABSTRACT

A photolithography method includes applying to a substrate a coating of a film forming composition containing a bonding resin and a film forming material and drying to form a film; selectively coating the film with a photosensitive composition including a photosensitizer to form a film pattern; exposing the film with the film pattern; and developing the film. Therefore, a film in a pattern and having excellent characteristics can be manufactured easily and efficiently. The photolithography method can be applied to any product which requires the formation of a film in a pattern.

6 Claims, No Drawings

SMART PHOTOLITHOGRAPHY

BACKGROUND OF THE INVENTION

1. Field of the Invention

The present invention relates to photolithography, and more particularly, to new photolithography used in forming film patterns, in which a mask is not required (named smart photolithography by the inventors of the prevent invention).

2. Description of the Related Art

Conventional methods for forming a film pattern include printing such as silk screen printing, photolithography and so on.

The printing method is mainly used in a plasma display panel (PDP) or a field emission display (FED), both being flat-panel display devices. However, according to this method, the thicknesses of the formed patterns are not uniform. Also, it is difficult to form fine patterns.

According to a conventional photolithography, a desired thick-film forming material is dispersed in a photoresist and a surfactant, a dispersing agent and a co-photosensitizer are added thereto to form a photoresist composition. The composition is applied as a coating on a substrate and dried. Then, only a predetermined portion of the substrate is exposed using a photomask and developed, thereby completing a desired film pattern. Such photolithography has the advantage that a fine pattern can be formed, compared to the above-described printing method, but has the following disadvantages.

First, the manufacturing process is long and complicated.

Second, it is very difficult to control processing conditions appropriately during exposure and developing processes. In detail, it is very difficult to appropriately control exposure processing conditions such as exposure time, exposure illuminance or exposure temperature, and development process conditions such as pressure of a developing solution. Since it is difficult to control the processing conditions to within a desirable range, the pattern quality fluctuates depending on changes in the exposure and development processing conditions.

Third, in the conventional exposure process, since exposure is performed for an individual substrate using a batch-type exposure stand, the exposure process bottlenecks the overall photolithography process, thereby lowering the manufacturing efficiency.

Fourth, since exposure direction is fixed in one direction, that is, the substrate must be exposed from the front only, the film which is produced always has uneven hardness. Thus, the pressure of the developing solution should be carefully controlled during the development process.

Fifth, in the case of forming fine patterns, defects in mask patterns such as deformation or blocked holes are frequently generated.

SUMMARY OF THE INVENTION

To solve the above problems, it is an objective of the present invention to provide a photolithography by which a film pattern having improved film characteristics can be manufactured easily and efficiently.

Accordingly, to achieve the above objective, there is provided a smart photolithography method comprising the steps of:

(a) forming a film by coating a film forming composition having a bonding resin and a film forming material on a substrate and drying the resultant;

(b) selectively coating a photosensitive composition comprising a photosensitizer only on a predetermined portion of the film, according to a desired film pattern;

(c) exposing the resultant obtained in step (b); and (d) forming a desired film pattern by developing the exposed resultant structure.

In step (b), a coating method of the photosensitive composition is not specifically restricted. Preferably, the photosensitive composition is sprayed through a nozzle according to the desired film pattern.

In step (c), a photo-reaction is caused in the portion where the photosensitive composition is coated without a photomask.

DESCRIPTION OF THE PREFERRED EMBODIMENT

Hereinbelow, smart photolithography according to the present invention will be described in detail.

First, a film forming composition including bonding a resin and a film forming material is manufactured. Here, the film forming composition includes polyvinyl alcohol as its main component and may further include an additives such as dispersants and surfactants.

Separately from the photosensitive composition a photoresist, composition, comprising a photosensitizer, is manufactured, preferably in a liquid phase. Such a photoresist composition basically includes a photosensitizer or a photoresist and may further include an organic solvent for adjusting viscosity, a polymer for adjusting viscosity, or a surfactant.

The photosensitizer is not specifically restricted, but sodium dichromate aqueous solution, ammonium dichromate aqueous solution, 4,4'-diazidostilbene-2,2'-sodium disulfonate (DAS) aqueous solution, 2,5-bis(4'-azido-2'-sulfobenzyliden) cyclopentanon disodium salt (DAP) aqueous solution or stilbazolium polyvinyl alcohol aqueous solution is used. The concentration of the photosensitizer or photoresist aqueous solution is preferably 0.01~5.0% by weight.

The film forming composition is applied as a coating on the substrate and dried to form a film. Here, the coating method is not specifically restricted but a spin coating method or a sedimentation coating method is preferably used.

As the substrate, a substrate for use in a vacuum fluorescent display (VFD), cathode ray tube (CRT), field emitting display (FED) or plasma display panel (PDP) may be employed. However, the substrate is not restricted to those used in display devices.

The photosensitive composition is selectively applied to on a predetermined portion of the dried film according to a desired film pattern. Preferably, the desired film pattern is determined in advance and the photosensitive composition is selectively sprayed only onto the predetermined portion of the substrate through an ink jet nozzle.

The substrate onto which the photosensitive composition is selectively applied is exposed to light from its inner surface, outer surface, or both surfaces, that is, in any direction. During the exposure process, a photomask is not necessary, unlike conventional photolithography. Also, instead of a conventional batch-type exposure stand, a tunnel-type exposure stand is used as the exposure device, so that continuous exposure can be performed.

In the exposure process of the present invention, unlike conventional photolithography, since a photosensitive composition is selectively applied on only a predetermined area of a film according to a desired film pattern, the quality deviation depending on the temperature, duration and illuminance of exposure is greatly decreased. In other words, a long exposure time or high exposure illuminance does not adversely affect the film pattern size. Thus, the adhesion of a film to a substrate can be improved through sufficient exposure time and illuminance.

After performing the exposure process, a developing solution is sprayed onto the substrate with an appropriate pressure for development, thereby completing a desired film pattern. During the development process, since the adhesion of the exposed film is very strong, the development pressure can be greatly increased, compared to the conventional process. Thus, it is easy to remove materials remaining on an undesired portion.

As described above, according to photolithography of the present invention, the tolerance in processing conditions can be greatly enhanced during exposure or development.

Also, if photolithography according to the present invention is applied to manufacturing a CRT, an exposure lens, which is an essential element in a conventional exposure technique, is not necessary. In general, the exposure lens is very expensive and difficult to manufacture. Therefore, since the exposure lens is not necessary, the manufacturing cost is reduced, and the lead time for new product development is shortened.

The present invention has the following advantages.

First, fine patterning is obtained, within the fine patterning resolution of an ink jet nozzle and a motor for driving a printer head.

Second, the quality fluctuation depending on temperature, duration and illuminance of exposure can be reduced by selectively applying a photosensitive composition comprising a photosensitizer only on a predetermined portion of a substrate. Also, film quality can be improved through sufficient exposure time and illuminance.

Third, during exposure, since the substrate can be irradiated from any direction, a tunnel-type exposure device can be used. Thus, continuous exposure is possible, which is suitable for mass production.

Fourth, since the adhesion of a formed film is very strong, the pressure with which the developer is sprayed can be increased. Thus, in the case of forming a fluorescent film, a residual color phenomenon which frequently occurs in the conventional art can be avoided.

Fifth, since a photomask is not necessary and an exposure lens and an exposure stand need not be specifically designed, the lead time for developing new products can be noticeably reduced and the manufacturing cost can be significantly reduced.

The smart photolithography according to the present invention can be applied to any product which requires the formation of a film pattern, for example, a VFD, a CRTa, FED, or, aPDP.

What is claimed is:

1. A maskless photolithography method comprising:
   forming a film by applying a coating of a film-forming composition, the film-forming composition including a bonding resin and a film-forming material, onto a substrate, and drying the coating to form a film;
   selectively applying a coating of a photosensitive composition, comprising a photosensitizer, to only a portion of the film to form a film pattern;
   exposing the film on which the film pattern is disposed; and
   developing the film.

2. The maskless photolithography method according to claim 1, including spraying the photosensitive composition through a nozzle onto the film to form the film pattern.

3. The maskless photolithography method according to claim 1, including exposing the film with the film pattern to light without a photomask.

4. The maskless photolithography method according to claim 1, including exposing the film, on which the film pattern is disposed, by irradiating at least one of the surfaces of the substrate with light.

5. The maskless photolithography method according to claim 1, including exposing the film, on which the film pattern is disposed, by irradiating the substrate with light from more than one direction.

6. The maskless photolithography method according to claim 1, including exposing the film, on which the film pattern is disposed, by irradiating two opposite surfaces of the substrate with light.

\* \* \* \* \*